United States Patent
Aoki et al.

(10) Patent No.: US 7,591,543 B2
(45) Date of Patent: Sep. 22, 2009

(54) PIEZOELECTRIC MEMBER, PIEZOELECTRIC MEMBER ELEMENT, LIQUID DISCHARGE HEAD IN USE THEREOF, LIQUID DISCHARGE APPARATUS AND METHOD OF MANUFACTURING PIEZOELECTRIC MEMBER

(75) Inventors: Katsumi Aoki, Yokohama (JP); Takanori Matsuda, Tokyo (JP); Toshihiro Ifuku, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 401 days.

(21) Appl. No.: 11/463,531

(22) Filed: Aug. 9, 2006

(65) Prior Publication Data

US 2007/0046734 A1 Mar. 1, 2007

(30) Foreign Application Priority Data

Aug. 23, 2005 (JP) .............................. 2005-241379

(51) Int. Cl.
 *B41J 2/045* (2006.01)
 *H01L 41/187* (2006.01)
(52) U.S. Cl. ........................................ 347/68; 310/358
(58) Field of Classification Search ................... 347/68, 347/70–72; 310/358
 See application file for complete search history.

(56) References Cited

U.S. PATENT DOCUMENTS

| 6,653,211 | B2 | 11/2003 | Unno et al. |
|---|---|---|---|
| 6,854,832 | B2 | 2/2005 | Matsuda |
| 6,927,084 | B2 | 8/2005 | Fukui et al. |
| 7,045,935 | B2 | 5/2006 | Matsuda et al. |
| 7,053,526 | B2 | 5/2006 | Unno et al. |
| 7,059,711 | B2 | 6/2006 | Aoto et al. |
| 7,120,978 | B2 | 10/2006 | Wasa et al. |
| 7,144,101 | B2 | 12/2006 | Ifuku et al. |
| 2004/0155559 | A1 | 8/2004 | Ifuku et al. |
| 2005/0127780 | A1 | 6/2005 | Ifuku et al. |
| 2005/0168112 | A1 | 8/2005 | Aoki et al. |
| 2005/0189849 | A1 | 9/2005 | Ifuku et al. |
| 2005/0219793 | A1 | 10/2005 | Matsuda et al. |
| 2006/0033404 | A1 | 2/2006 | Fukui et al. |
| 2006/0049135 | A1 | 3/2006 | Okabe et al. |
| 2007/0046152 | A1* | 3/2007 | Ifuku et al. .................. 310/358 |
| 2007/0046153 | A1 | 3/2007 | Matsuda et al. |
| 2007/0046154 | A1* | 3/2007 | Ifuku et al. .................. 310/358 |
| 2007/0048190 | A1 | 3/2007 | Ifuku et al. |
| 2007/0060467 | A1 | 3/2007 | Matsuda et al. |

FOREIGN PATENT DOCUMENTS

JP 3397538 2/2003

OTHER PUBLICATIONS

S.K. Singh et al., "Crystalline Properties of Ferroelectric—Relaxor PMN-PT Thin Films by Pulsed Laser Deposition," *IEEE* 133-36 (2002).

* cited by examiner

*Primary Examiner*—An H Do
(74) *Attorney, Agent, or Firm*—Fitzpatrick, Cella, Harper & Scinto

(57) ABSTRACT

A piezoelectric member of single crystal or uniaxial crystal and the piezoelectric member has a perovskite type oxide of a general formula $ABO_3$ with a main component of the A being Pb and a main component of the B containing at least three kinds of elements selected from the group consisting of Mg, Zn, Sc, In, Yb, Ni, Nb, Ti, and Ta, and a film thickness of the piezoelectric member is not less than 1 μm and not more than 10 μm and the piezoelectric member fulfills a predetermined conditions on a relative dielectric constant or a Curie temperature.

15 Claims, 7 Drawing Sheets

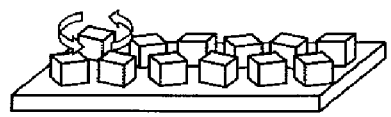 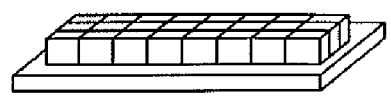
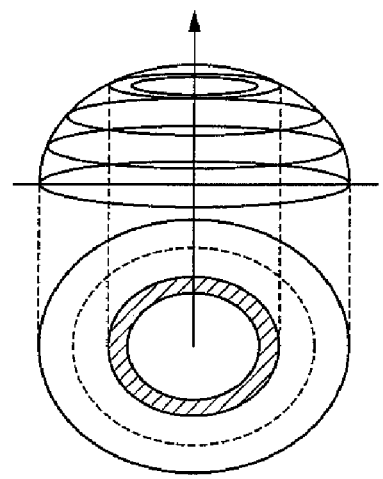 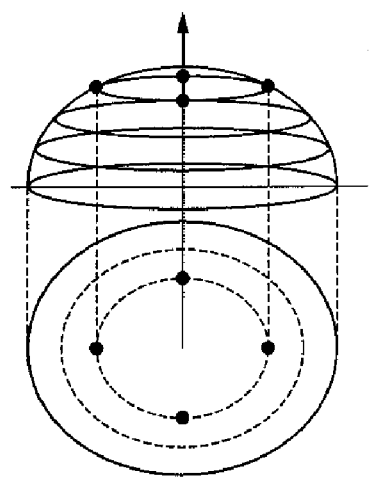
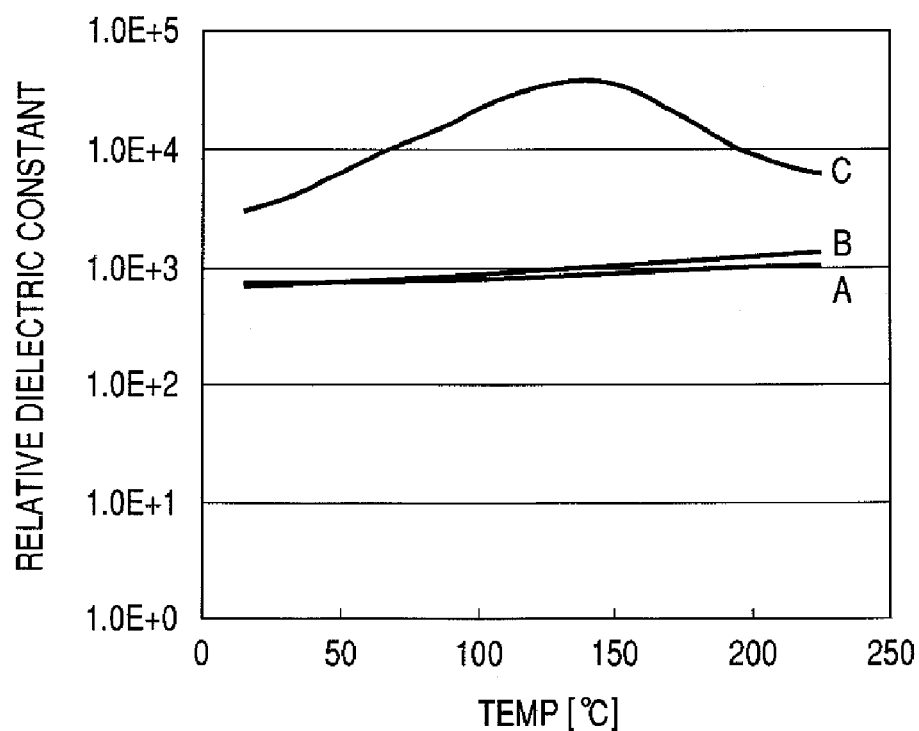

PIEZOELECTRIC MEMBER, PIEZOELECTRIC MEMBER ELEMENT, LIQUID DISCHARGE HEAD IN USE THEREOF, LIQUID DISCHARGE APPARATUS AND METHOD OF MANUFACTURING PIEZOELECTRIC MEMBER

BACKGROUND OF THE INVENTION

1. Field of the Invention

The present invention relates to a piezoelectric member, a piezoelectric member element, an actuator in use thereof, and a liquid discharge head (an ink jet head) as well as a method of manufacturing the piezoelectric member.

2. Description of the Related Art

Metal oxide ceramics consisting of PZT($Pb(Zr,Ti)O_3$) system are generally known as a piezoelectric member. These PZT system ceramics have excellent piezoelectric characteristics and are widely used for a piezoelectric actuator, a piezoelectric ignition element, a piezoelectric buzzer, a piezoelectric transformer, and the like. However, a strain amount thereof is around 0.1 to 0.15% even at a maximum and may not be sufficient in the case of being used as a piezoelectric actuator and the like. In recent years, for a purpose of obtaining further piezoelectric characteristics or a large amount of strain, relaxor material is being considered and, for example, Japanese Patent No. 3397538 shows a method of synthesizing PZN-PT and PMN-PT with flux fusion. Such a synthesizing method is reported to derive a bulk type single crystal and give rise to material with a large strain amount in excess of 1%. In addition, forming film directly on a substrate with a film forming method such as a sol-gel method, a hydrothermal synthesis method, a sputtering method, a MBE method, a PLD method, a CVD method, and a MO-CVD method in use of relaxor material is being considered. For example, PMN-PT film is reported to have been formed with a PLD method in Applications of Ferroelectrics, 2002. ISAF 2002. Proceeding of the 13th IEEE International Symposium P133-136.

However, for example, a MEMS piezoelectric actuator, development of which is being proceeded enthusiastically in recent years, is finely structured and therefore, production thereof is very difficult since single crystal is required to be made into thin pieces for junction in the case of using single crystal material which has been caused to grow in a bulk state as described in Japanese Patent No. 3397538.

In addition, the relaxor material has a large relative dielectric constant and can be made into thinner film so that the capacitance of a piezoelectric element gets larger. Accordingly, supply of electric power to drive it gives rise to phase delay of supply power due to a relationship with wire resistance, an issue of delay in drive response to a high frequency drive accompanied thereby, an issue such as a tendency to provide larger driving power supply capacity, and the like.

In particular, for an ink jet head of an ink jet printer where a piezoelectric member element is being utilized as an actuator, a discharge ink droplet is attempted to be made minute in recent years so that a formed image thereof derives a more sophisticated image quality. In addition, a the number of discharge ink droplets required for image forming accompanied thereby tends to increase. In addition, in order to attain high speed, high frequency of supply driving power, intensified density, and extension of ink jet head nozzle is being developed. That is, the ink jet head is required to discharge minute ink droplets stably from a number of ink jet head nozzles at a high driving frequency. Therefore, the issue of delay in drive response to a high frequency drive and the issue of requiring a larger driving power supply capacity are significant problems.

Moreover, in general the relaxor material is accompanied by a relief phenomenon in the dielectric constant due to temperature change and the variation in the dielectric constant due to temperature change will get larger within a temperature range in the actual use range of the piezoelectric member element since a Curie temperature Tc thereof is low when compared with a piezoelectric material such as PZT. Accordingly, the case of application into the ink jet head gives rise to an issue that stable discharge performance cannot be maintained under various use environments and such environments that will increase temperature of a piezoelectric member element due to continued use.

SUMMARY OF THE INVENTION

The present invention has been attained for the above-described problems, and it is an object thereof to provide a piezoelectric member and a piezoelectric member element with good driving response in a high-frequency region. In addition, it is another object to provide a method of manufacturing a piezoelectric member which will enable reduction in loads for circuit design such as a wiring resistance limit value, a driving power supply capacity of the piezoelectric member element, and the like and which can maintain stable piezoelectric characteristics even under any use environments.

In order to attain the above described objects, the present inventors have considered to think of the following invention by forming film with a bulk state piezoelectric member deriving a relief phenomenon of a dielectric constant by way of film forming means and assessing as well as verifying that dielectric phenomenon.

The above described object is attained by a perovskite type oxide being a piezoelectric member of single crystal or uniaxial crystal in the case where the above described piezoelectric member is of the general formula $ABO_3$ where a main component of A is Pb and a main component of B consists of at least three kinds of elements selected from the group consisting of Mg, Zn, Sc, In, Yb, Ni, Nb, Ti, and Ta and where the following (1) and (2) are fulfilled.

(1) A piezoelectric member fulfilling:

$$10 > (\epsilon_{MAX} - \epsilon_{RT})/(t_{MAX} - 25) > 0.1$$

where $\epsilon_{RT}$ is the relative dielectric constant of the above described piezoelectric member at 25° C. and 1 kHz as well as $\epsilon_{MAX}$ is the maximum value of the relative dielectric constant at not more than 200° C. and 1 kHz, and $t_{MAX}$ is a temperature indicative of the maximum value of the relative dielectric constant.

(2) A piezoelectric member fulfilling:

$$Tc_{thin} > Tc_{bulk} + 50$$

where $Tc_{thin}$ is a Curie temperature of the above described piezoelectric member and $Tc_{bulk}$ is a Curie temperature of a bulk state piezoelectric member with the same metal atomic number proportion as that of the above described piezoelectric member excluding Pb.

In addition, the above described relates to a piezoelectric member element having a pair of electrodes in the above described piezoelectric member. In addition, the above described relates to a liquid discharge head of a discharging liquid with the above described piezoelectric member element.

According to the present invention, a piezoelectric member as well as a piezoelectric member element carrying out excellent piezoelectric characteristics and with good driving response in a high frequency region can be provided. In addition, the present invention will enable reduction in circuit designing load such as wiring resistance limit value, driving power supply capacity, and the like of a piezoelectric element and can provide a method of manufacturing a piezoelectric member which can maintain stable piezoelectric characteristics even under any use environments.

[Piezoelectric Member and Piezoelectric Member Element]

A piezoelectric member element of the present invention has a piezoelectric member (may be occasionally referred to as a film piezoelectric member) and a pair of electrodes in contact to the piezoelectric member. And the above described piezoelectric member is a piezoelectric member of single crystal or uniaxial crystal and the above described piezoelectric member has a perovskite type oxide of a general formula $ABO_3$. There, a main component of A is Pb and a main component of B contains not less than three kinds of elements selected from the group consisting of Mg, Zn, Sc, In, Yb, Ni, Nb, Ti, and Ta. Moreover, film thickness of the above described piezoelectric member is not less than 1 μm and not more than 10 μm and where the following (1) and (2) are applicable.

$$10 > (\epsilon_{MAX} - \epsilon_{RT})/(t_{MAX} - 25) > 0.1 \text{ is fulfilled} \quad (1)$$

where $\epsilon_{RT}$ is the relative dielectric constant of the above described piezoelectric member at 25° C. and 1 kHz as well as $\epsilon_{MAX}$ is the maximum value of the relative dielectric constant at not more than 200° C. and 1 kHz, and $t_{MAX}$ is a temperature indicative of the maximum value of the relative dielectric constant.

$$Tc_{thin} > Tc_{bulk} + 50 \text{ is fulfilled} \quad (2)$$

where $Tc_{thin}$ is a Curie temperature of the above described piezoelectric member and $Tc_{bulk}$ is a Curie temperature of a bulk state piezoelectric member with the same metal atomic number proportion as that of the above described piezoelectric member excluding Pb.

Here, a piezoelectric member element means an element with a piezoelectric member that is sandwiched by electrodes and expands or contracts by applying an electric field.

As a method of film forming preferred for forming film into a piezoelectric member of the present invention, a generally so-called method of forming film selected from the group consisting of a sol-gel method, a hydrothermal synthesis method, a sputtering method, a MBE method, a PLD method, a CVD method, a MO-CVD method, and the like can be nominated. These methods of forming film are methods of forming film preferred for forming film to derive film thickness in an order of several nm to 50 μm. A bulk state piezoelectric member refers to a piezoelectric member, which is produced with a sintering method and a pressured sintering method used in general as a method of manufacturing ceramics or a production method such as fusion flux method used as a method of manufacturing single crystal material and has thickness of at least larger than 10 μm at the time of production.

Uniaxial crystal refers to crystal having a single crystal orientation in film thickness direction and it does not matter in particular where the inner film plane orientation of the crystal is directed. For example, <100> uniaxial crystal is a film configured by crystal with film thickness orientation only in <100> orientation. It can be confirmed with X-ray diffraction whether or not a piezoelectric film is uniaxial crystal. For example, in case of <100> uniaxial crystal in a PZT perovskite type structure, peaks only of (L00) planes (L=1, 2, 3 . . . n: n is integer) such as {100}, {200} are detected as to peaks resulting from piezoelectric film as a result of 2θ/θ measurement on X-ray diffraction. In addition, at the time when apogee measurement on {110} non-symmetrical plane, ring form pattern is derived at the same radius position giving approximately 45° gradient from the center as in FIG. 9A.

A single crystal refers to crystal having a single crystal orientation in film thickness direction and inner film plane orientation. For example, <100> single crystal is film configured by crystal with film thickness orientation only in <100> orientation and a certain orientation in inner film plane orientation only in <110> orientation. It can be confirmed with X-ray diffraction whether or not a piezoelectric film is uniaxial crystal. For example, in case of <100> single crystal in a PZT perovskite type structure, peaks only of (L00) planes (L=1, 2, 3 . . . n: n is integer) such as {100}, {200} are detected as to peaks resulting from piezoelectric film as a result of 2θ/θ measurement on X-ray diffraction. In addition, at the time when apogee measurement on {110} non-symmetrical plane, spot form pattern being quadruple symmetric in every 90° is derived at the same radius position giving approximately 45° gradient from the center as in FIG. 9B.

In addition, for example in a PZT perovskite type structure in <100> orientation, there is crystal deriving at the time when apogee measurement on {110} non-symmetrical plane, pattern being octo-symmetric or multi-symmetric at dozen times is derived at the same radius position giving approximately 45° gradient from the center. Or crystal may not be patterned in spots but occasionally oval as well. Those kinds of crystal are crystal shown symmetry between single crystal and uniaxial orientation of the present invention and therefore are regarded widely as single crystal as well as uniaxial crystal. Likewise, in a case where a plurality of crystal phases of single crystal and tetragonal, monoclinic crystal and rhombohedral, tetragonal, and rhombohedral or all of them are commingled (mixed phases), in a case where crystal resulting from twin crystal is commingled or in a case where there exists transfer or defect and the like is regarded widely as single crystal and uniaxial crystal. When a number of crystal phases are commingled (mixed phase) as referred here, a grain boundary will not be present to be included in a multicrystal state with a plurality of crystal phases allocated in respectively different crystal axis. That is, a plurality of crystal phases are present in a single perovskite type oxide particle so as to make one-body structure to give rise to single crystal or uniaxial orientation.

Here, a bulk state piezoelectric member in composition with the same metal atomic number proportion besides Pb as that of a film piezoelectric member which a piezoelectric member element of the present invention has a relief phenomenon characteristics toward changes in temperature of relative dielectric constant and is called therefore in general a piezoelectric member relaxor material. The present inventors used film forming means to form film from a film piezoelectric member in composition as described above into a state of single crystal or uniaxial crystal to find out that the relief phenomenon characteristics toward changes in temperature of relative dielectric constant thereof is significantly different from those of a bulk state piezoelectric member.

The present inventors presume that the reason thereof is aptness of a film piezoelectric member to binding (stress) from a substrate since the film piezoelectric member is formed on the substrate. It is presumed that the application of stress onto the film piezoelectric member from the substrate causes freezing of a dielectric relief phenomenon so that the reduction in the absolute value of the relative dielectric constant as well as the relief phenomenon are regulated to be low.

In the present invention, changes in the temperature of a substrate after forming film has been noted so that a manner of how stress is applied from the substrate has been adjusted positively and the adjustment in the relative dielectric constant effective at the time of use of a piezoelectric element as well as adjustment in an amount of the temperature changes in the relative dielectric constant have been found out.

The reason why the relative dielectric constant of 1 kHz is measured and compared is as follows. Even in the case of presence of wiring resistance of a measurement system and the resistance components of a measurement system such as contact resistance between measurement prober and samples, the resistance components of the measurement system hardly affect impedance as well as the phase measurement in order to attain a relative dielectric constant of a film piezoelectric member. Accordingly, the capacitance (relative dielectric constant) of a film piezoelectric member can be estimated correctly. In particular, at the time when the temperature of the measurement system has been caused to change, values of the resistance component of the measurement system will change so that the correct estimation of capacitance (relative dielectric constant) of the film piezoelectric member can be protected from becoming unfeasible. As described above, the reason thereof is that the changes as to temperature of the capacitance (relative dielectric constant) of a film piezoelectric member can be estimated correctly.

In addition, a measurement range of the change in temperature of the capacitance (relative dielectric constant) of a film piezoelectric member is fixed at from a room temperature of 25° C. to 200° C. or a temperature range fixed in consideration of an actual use temperature range as in a film piezoelectric member of the present invention.

In the case of deriving $10 \leq (\epsilon_{MAX} - \epsilon_{RT})/(t_{MAX} - 25)$, events as described below will occur in the case of application, for example, to an ink jet head as an example of a preferred use method of film piezoelectric member element of the present invention. That is, in the case where changes in temperature have occurred to use environments, at the time of use of the ink jet head, changes in piezoelectric characteristics are significant and moreover changes in the capacitance of piezoelectric element due to increase in the relative dielectric constant get larger resulting in the occurrence of change in the displacement amount as well as in delay in the displacement. Therefore, the variation of a discharge liquid amount will be caused to occur in the same driving method (with driving voltage and driving waveform). In addition, in the case of deriving $(\epsilon_{MAX} - \epsilon_{RT})/(t_{MAX} - 25) \leq 0.1$, an outcome when a phase change of determining piezoelectric characteristics of a piezoelectric member resulting from a relief phenomenon of the original relative dielectric constants is caused to freeze is shown to derive poor piezoelectric characteristics. $5 > (\epsilon_{MAX} - \epsilon_{RT})/(t_{MAX} - 25) > 0.2$ is more preferable.

In addition, the reason why composition of the film piezoelectric member and the bulk state piezoelectric member for comparing Tc have been made to set the metal atomic number proportion excluding Pb the same is as follows. In single crystal as well as uniaxial crystal defined herein, of a film piezoelectric member formed with a film forming method, Pb being the main component of A may be unevenly distributed between crystal except crystal portions the structure of which can be determined by X-ray structure analysis. This is a ceramic multi-crystal material and a very fine region compared with a commonly called grain boundary and is deemed to be a defect of the crystal. On the other hand, as for piezoelectric characteristics, a crystal portion that can determine the structure is deemed to dominantly determine the characteristics. In contrast, since a bulk state piezoelectric member is manufactured in a method of manufacturing single crystal such as the above-described fusion flux method, Pb being the main component of the A site is also configured approximately in a stoichiometrical mixture ratio in consideration of its production method. In view of the above-described circumstances, it is deemed to be reasonable to compare the bulk state piezoelectric member with composition stipulated with composition in exception of Pb.

In $Tc_{thin} \leq Tc_{bulk} + 50$, changes in piezoelectric characteristics as well as changes in the relative dielectric constant are large for changes in temperature assumed under use environments of a piezoelectric member element and displacement behavior of the piezoelectric member element is not stable. $Tc_{thin} > Tc_{bulk} + 100$ is more preferable.

The above-described piezoelectric member element of the present invention preferably fulfills $$\epsilon_{Rt} < 1200$$

where the relative dielectric constant is $\epsilon_{Rt}$ of the above-described film piezoelectric member at 25° C. and 1 kHz. In the case of $\epsilon_{Rt} \geq 1200$, delay in displacement behavior will get larger in response to driving signals of the piezoelectric member element and stable performance may not be derived.

Further features of the present invention will become apparent from the following description of exemplary embodiments with reference to the attached drawings.

BRIEF DESCRIPTION OF THE DRAWINGS

FIG. 8A shows a state where an upper electrode has been formed on a piezoelectric member, FIG. 8B shows a state where the film piezoelectric member has been removed through a dry etching process, FIG. 8C shows a state where an Si substrate has been brought into two-step etching through a dry etching process, and FIG. 8D shows a state where a nozzle plate has been bonded together with the Si substrate to form an ink jet head.

FIGS. 9A and 9B are drawings for explaining patterns derived by X-ray diffraction and FIG. 9A shows a pattern in case of <100> uniaxial crystal and FIG. 9B shows a pattern in case of <100> single crystal.

FIG. 10 is a graph showing temperature dependency of relative dielectric constants of the present example and a bulk state piezoelectric member.

DESCRIPTION OF THE EMBODIMENTS

Figure 1:
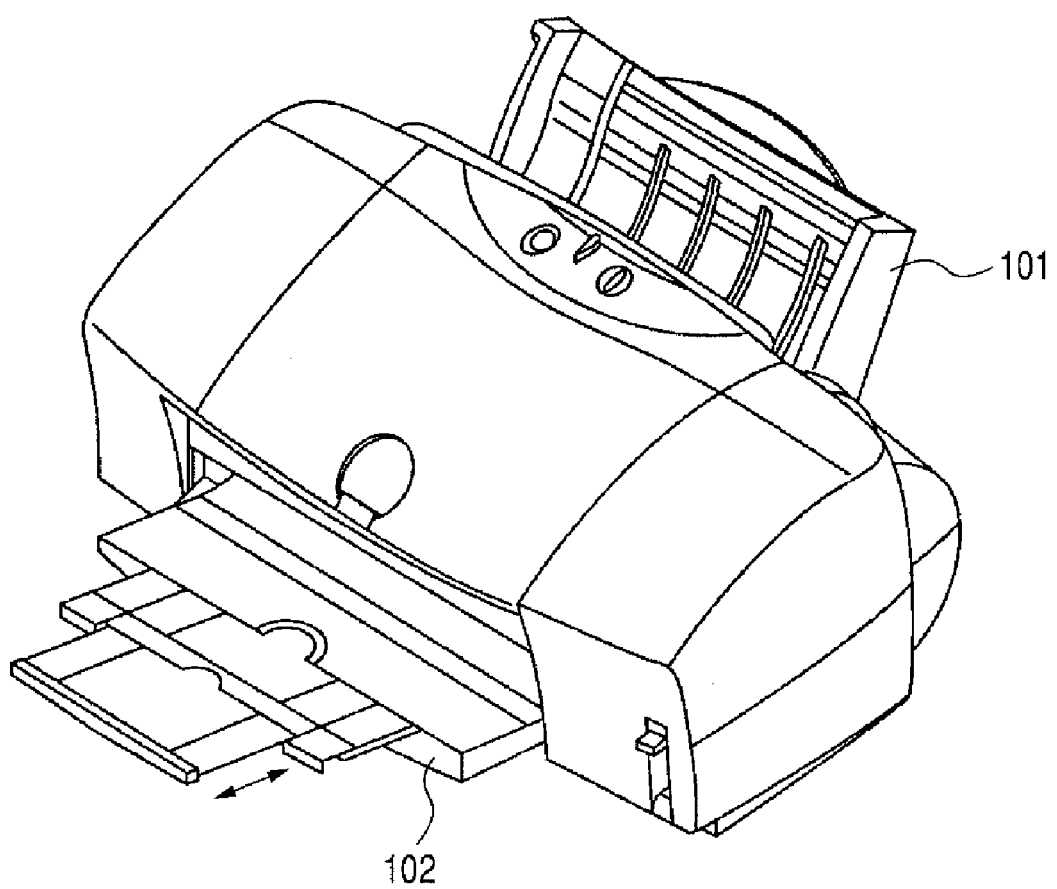
FIG. 1 is a schematic view of an ink jet recording apparatus in use of an ink jet head to which a piezoelectric member element of the present invention can be preferably applied.

In a first embodiment preferable as composition of a film piezoelectric member that a piezoelectric member element of the present invention has, the above-described perovskite type oxide $ABO_3$ can be expressed by $(Pb_k,\alpha_1)_x(Mg_m,Nb_n,Ti_o,\beta_p)_yO_3$. There, $1 \leq x/y < 1.5$, $k+1=1$, $0.7 \leq k \leq 1$, $0 \leq 1 \leq 0.3$, $m+n+o+p=1$, $0.1 < m \leq 0.3$, $0.3 < n < 0.5$, $0.2 < o < 0.4$, and $0 \leq p < 0.3$ are fulfilled. In addition, α includes any element selected from the group consisting of La, Ca, Ba, Sr, Bi, and Sb while β includes any element selected from the group consisting of Pb, Sc, In, Yb, Ni, Ta, Co, W, Fe, and Sn.

In a second embodiment preferable as composition of a film piezoelectric member that a piezoelectric member element of the present invention has, the above-described perovskite type oxide $ABO_3$ can be expressed by $(Pb_k,\alpha_1)_x(Zn_m,Nb_n,Ti_o,\beta_p)_yO_3$. There, $1 \leq x/y < 1.5$, $k+1=1$, $0.7 \leq k \leq 1$, $0 < 1 < 0.3$, $m+n+o+p=1$, $0.2 < m < 0.4$, $0.5 < n < 0.7$, $0.05 < o < 0.2$, and $0 \leq p < 0.3$ are fulfilled. In addition, α includes any element selected from the group consisting of La, Ca, Ba, Sr, Bi, and Sb while β includes any element selected from the group consisting of Pb, Sc, Yb, Ta, Mg, Ni, Co, W, Fe, Sn, and In.

In a third embodiment preferable as composition of a film piezoelectric member that a piezoelectric member element of the present invention has, the above-described perovskite type oxide $ABO_3$ can be expressed by $(Pb_k,\alpha_1)_x(Ni_m,Nb_n,Ti_o,\beta_p)_yO_3$. There, $1 \leq x/y < 1.5$, $k+1=1$, $0.7 \leq k \leq 1$, $0 \leq 1 \leq 0.3$, $m+n+o+p=1$, $0.1 \leq m \leq 0.3$, $0.3 \leq n \leq 0.5$, $0.3 \leq o \leq 0.5$, and $0 \leq p < 0.3$ are fulfilled. In addition, α includes any element selected from the group consisting of La, Ca, Ba, Sr, Bi, and Sb while β includes any element selected from the group consisting of Pb, Sc, In, Yb, Mg, Ta, Co, W, Fe, and Sn.

In a fourth embodiment preferable as composition of a film piezoelectric member that a piezoelectric member element of the present invention has, the above-described perovskite type oxide $ABO_3$ can be expressed by $(Pb_k,\alpha_1)_x(Sc_m,Nb_n,Ti_o,\beta_p)_yO_3$. There, $1 \leq x/y < 1.5$, $k+1=1$, $0.7 \leq k \leq 1$, $0 < 1 < 0.3$, $m+n+o+p=1$, $0.1 \leq m \leq 0.4$, $0.1 \leq n \leq 0.4$, $0.3 \leq o \leq 0.5$, and $0 \leq p \leq 0.3$ are fulfilled. In addition, α includes any element selected from the group consisting of La, Ca, Ba, Sr, Bi, and Sb while β includes any element selected from the group consisting of Pb, Ta, In, Yb, Mg, Ni, Co, W, Fe, and Sn.

In a fifth embodiment preferable as composition of a film piezoelectric member that a piezoelectric member element of the present invention has, the above-described perovskite type oxide $ABO_3$ can be expressed by $(Pb_k,\alpha_1)_x(Sc_m,Ta_n,Ti_o,\beta_p)_yO_3$. There, $1 \leq x/y < 1.5$, $k+1=1$, $0.7 \leq k \leq 1$, $0 \leq 1 \leq 0.3$, $m+n+o+p=1$, $0.1 \leq m \leq 0.4$, $0.1 \leq n \leq 0.4$, $0.3 \leq o \leq 0.5$, and $0 \leq p \leq 0.3$ are fulfilled. In addition, α includes any element selected from the group consisting of La, Ca, Ba, Sr, Bi, and Sb while β includes any element selected from the group consisting of Pb, Nb, In, Yb, Mg, Ni, Co, W, Fe, and Sn.

In a sixth embodiment preferable as composition of a film piezoelectric member that a piezoelectric member element of the present invention has, the above-described perovskite type oxide $ABO_3$ can be expressed by $(Pb_k,\alpha_1)_x(Yb_m,Nb_n,Ti_o,\beta_p)_yO_3$. There, $1 \leq x/y < 1.5$, $k+1=1$, $0.7 \leq k \leq 1$, $0 \leq 1 \leq 0.3$, $m+n+o+p=1$, $0.1 \leq m \leq 0.4$, $0.1 \leq n \leq 0.4$, $0.4 \leq o \leq 0.6$, and $0 \leq p \leq 0.3$ are fulfilled. In addition, α includes any element selected from the group consisting of La, Ca, Ba, Sr, Bi, and Sb while β includes any element selected from the group consisting of Pb, Sc, In, Ta, Mg, Ni, Co, W, Fe, and Sn.

In a seventh embodiment preferable as composition of a film piezoelectric member that a piezoelectric member element of the present invention has, the above-described perovskite type oxide $ABO_3$ can be expressed by $(Pb_k,\alpha_1)_x(In_m,Nb_n,Ti_o,\beta_p)_yO_3$. There, $1 \leq x/y < 1.5$, $k+1=1$, $0.7 \leq k \leq 1$, $0 \leq 1 \leq 0.3$, $m+n+o+p=1$, $0.2 \leq m \leq 0.4$, $0.2 \leq n \leq 0.4$, $0.2 \leq o \leq 0.5$, and $0 \leq p \leq 0.3$ are fulfilled. In addition, α includes any element selected from the group consisting of La, Ca, Ba, Sr, Bi, and Sb while β includes any element selected from the group consisting of Pb, Sc, Yb, Ta, Mg, Ni, Co, W, Fe, and Sn.

Since the above-described composition range will be lead to an unstable state with crystal structure apt to change or application of an electric field is apt to result in phase changes, a large piezoelectric constant is deemed to be derived.

A single crystal perovskite type oxide material expressed by the above-described $ABO_3$ can contain a Pb element as A component and B component as well, and contains that as bivalent metal in case of containing it as A component while contains that as quadrivalent metal in case of containing it as B component.

Moreover, the above-described perovskite type oxide $ABO_3$ preferably contains Zr as B component over the entire B component in an amount not in excess of 5 mol % and more preferably contains in an amount not in excess of 2 mol %.

Metal material or oxide material can be used as electrode material. Au, Pt, Ni, Cr, Ir, and the like can be nominated as metal material. In addition, lamination structure of Ti and Pb for example will do as well. Those selected from the group consisting of $SrTiO_3$, $SrRuO_3$, $IrO_2$, $RuO_2$, $Pb_2Ir_2O_7$, and the like that are doped with La or Nb are nominated as oxide material. At least any one of those upper and lower electrodes preferably has crystal structure. Material and configuration of the upper and the lower electrodes may be the same or may be different and when one is a common electrode then the other will become a driving electrode.

[Method of Manufacturing Piezoelectric Member]

A piezoelectric member of the present invention is perovskite type oxide of single crystal or uniaxial crystal of a general formula $ABO_3$ where a main component of A is Pb and a main component of B consists of at least three or more kinds of elements selected from the group consisting of Mg, Zn, Sc, In, Yb, Ni, Nb, Ti, and Ta. This piezoelectric member film is formed on a substrate with a sputtering method. In particular, it is preferable to form film on a substrate with an RF magnetron sputtering method being film forming means in use of such raw material sintering that a piezoelectric member derived at last will attain an objective composition. That production method has the following steps:

(Step 1) Temperature of film formed on the above-described substrate is caused to drop from the film forming temperature to a predetermined temperature of not less than $Tc_{bulk}$+about 100° C. where $Tc_{bulk}$ is a Curie temperature of a bulk state piezoelectric member with the same metal atomic number proportion as that of the described piezoelectric member besides Pb. "$Tc_{bulk}$+about 100° C." may be a range of $Tc_{bulk}$+80° C. to 120° C. In this temperature range, atoms constituting the piezoelectric member thin film may be rearranged and the composition distribution in the film in the direction of film thickness may be removed. That is, stopping the RF magnetron sputtering power supply, the substrate temperature is caused to drop to a predetermined temperature.

(Step 2) The above described film is kept at the above described predetermined temperature. That period is preferably not less than one minute.

(Step 3) The above described film is caused to drop to a temperature of not more than 50° C. Here, cooling speed at the time of temperature drop is preferably not less than 30° C./min.

Particular methods will be described in detail in examples described below.

[Liquid Discharge Head]

Figure 3:
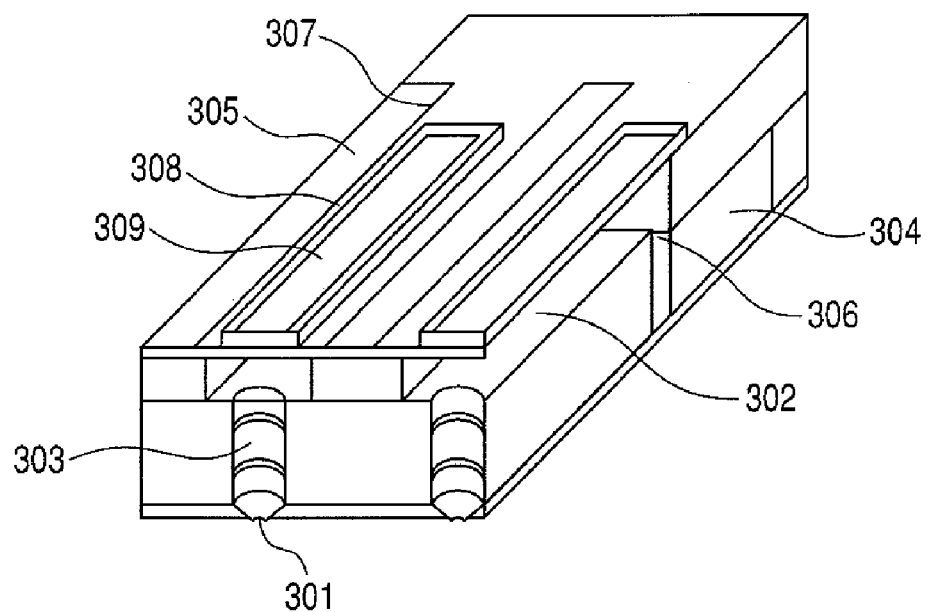
FIG. 3 is a schematic view showing an example of the structure of an ink jet head.

A liquid discharge head of the present invention has a discharge port, an individual liquid chamber communicated with the discharge port, a piezoelectric member element provided in relation to the individual liquid chamber and a vibration described piezoelectric member element. And it is a liquid discharge head, in use of the above described piezoelectric member element as the above described piezoelectric member element, of discharging liquid inside the above described individual liquid chamber from the above described discharge port with volumetric change inside the above described individual liquid chamber caused by the above described vibration plate. The liquid discharge head in application of a piezoelectric member element of the present invention will be described schematically with reference to FIG. 3. FIG. 3 is a schematic view showing structure of an example of an ink jet head being a liquid discharge head. Reference numeral 301 denotes a discharge port, reference numeral 302 denotes a communication hole for connecting an individual liquid chamber 303 to a discharge port 301, reference numeral 304 denotes a common liquid chamber, reference numeral 306 denotes a choking portion for limiting ink flow between the individual liquid chamber 303 and the common liquid chamber, reference numeral 305 denotes a vibration plate, reference numeral 307 denotes a lower electrode, reference numeral 308 denotes a film piezoelectric member, and reference numeral 309 denotes an upper electrode. Those shapes will not be limited in particular by the present drawing but are examples in case of applying the piezoelectric member element of the present invention to an ink jet head. Here, the piezoelectric member element in this example is a portion of a film piezoelectric member 308 sandwiched by the lower electrode 306 and the upper electrode 18.

Figure 4:
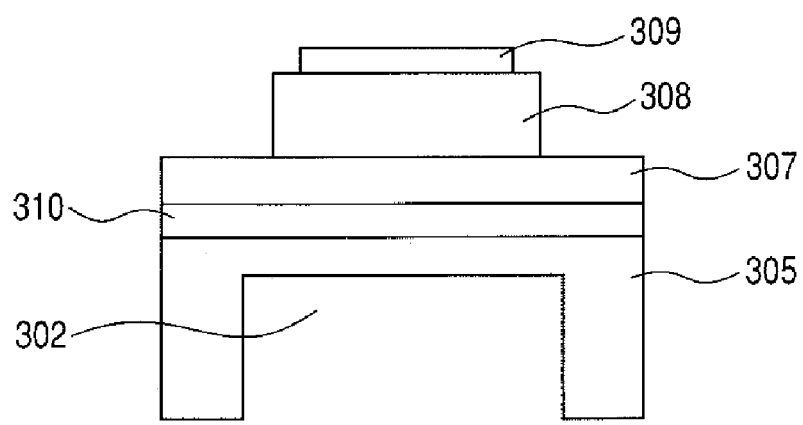
FIG. 4 is a sectional view in a width direction of a portion including the film piezoelectric member in FIG. 3.

A portion related to the film piezoelectric member 308 of the present invention will be described in further detail with reference to FIG. 4. FIG. 4 is a sectional view of the piezoelectric member 308 in FIG. 3 in a width direction. Reference numeral 308 denotes a film piezoelectric member, reference numeral 305 denotes a vibration plate, and reference numeral 307 denotes a lower electrode. An intermediate layer 310 having, for example, a function such as a buffer layer for controlling crystal properties may have a structure with a plurality of layers between the vibration plate 305 and the lower electrode 307. In addition, the lower electrode 307 as well as the upper electrode 309 may also have a structure with a plurality of layers functioning as a layer for improving close contact and the like. A sectional shape of the film piezoelectric member 308 is shown in a rectangular shape but the shape will not be limited thereto.

The lower electrode 307 is pulled out to reach a portion where the film piezoelectric member 308 is not present while the upper electrode 309 is pulled out to the side (not shown in the drawing) opposite from the lower electrode 307 and is connected to a driving power supply. In FIG. 3 and FIG. 4, the lower electrode shows a state subject to patterning but may be present in a portion as well as where no piezoelectric film is present.

Thickness of the vibration plate 305 of the ink jet head is preferably 1.0 to 10 μm and more preferably 1.0 to 6.0 μm. This thickness will include thickness of the buffer layer in the case where the above described buffer layer 19 is present. Film thickness of the lower electrode 307 and the upper electrode 309 is preferably 0.05 to 0.4 μm and more preferably 0.08 to 0.2 μm.

Figure 5:
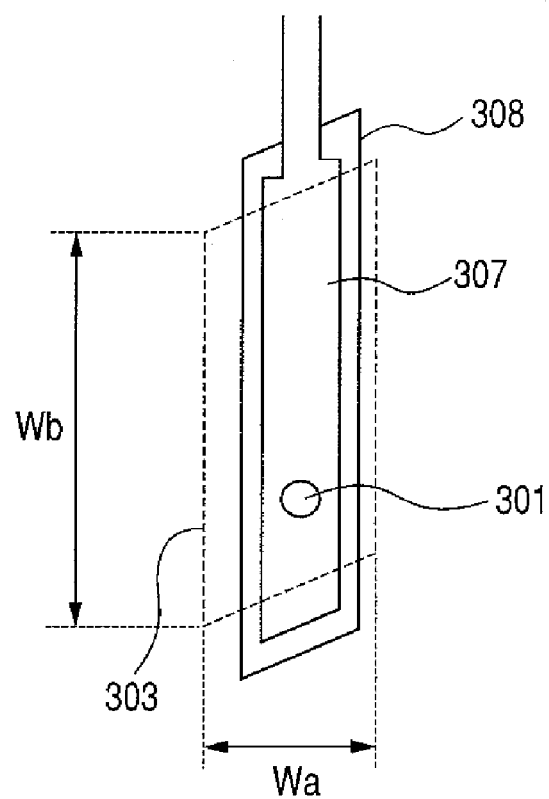
FIG. 5 is a diagram showing the structure of one unit of an ink jet head.

FIG. 5 is a drawing showing the structure of one unit of the ink jet head. Width Wa of the individual liquid chamber 303 is preferably 30 to 180 μm. Length Wb of the individual liquid chamber 303 depends on discharge liquid/droplet amount but is preferably 0.3 to 6.0 mm. The discharge port 301 is preferably shaped circular or like a star and a radius is preferably 7 to 30 μm. It is preferably shaped to taper so as to expand toward the direction of the communication hole 302. Length of the communication hole 302 is preferably 0.05 mm to 0.5 mm. Length in excess hereof might reduce discharge speed of droplets. In addition, length less than that might enlarge variation in discharge speed of droplets discharged from respective discharge ports.

(Vibration Plate Material)

For main material used as the vibration plate 305, oxide and/or Si selected from the group consisting of $ZrO_2$, $BaTiO_3$, MgO, $SrTiO_3$, $MgAl_2O_4$, and the like doped with rare earth elements containing Sc and Y may be used. Si may contain dopant element such as B element and the like. The vibration plate 305 with those materials as main components shows a certain particular controlled crystal structure, and preferably the crystal structure of (100), (110), or (111) should be orientated at intensity of not less than 80% and preferably from not less than 99% to 100%. Here, "99%" means that the main orientation is present by 1% at XRD intensity and the different orientations are present.

(Electrode Material)

As electrode material, those similar to electrodes of the above described piezoelectric member element can be used.

In particular, as the lower electrode 307 provided on the buffer layer, the following one is exemplified. On 10% $Y_2O_3$—$ZrO_2(111)$, those selected from the group consisting of Pt(100), Ir(100), $SrRuO_3(100)$, $Sr_{0.96}La_{0.04}TiO_3(100)$, $Sr_{0.97}Nb_{0.03}TiO_3(100)$, $BaPbO_3(100)$, and the like are nominated. On $SrTiO_3(100)$, (100) film selected from the group consisting of Pt(100), Ir(100), $SrRuO_3(100)$, $Sr_{0.97}La_{0.03}TiO_3(100)$, $Sr_{0.97}Nb_{0.03}TiO_3(100)$, $BaPbO_3$ (100), and the like is nominated. On $BaTiO_3(001)$ and $MgAl_2O_4(100)$, (100) film is nominated.

As the lower electrode 307 provided on the vibration plate 305 with no buffer layer, those selected from the group consisting of $SrRuO_3(100)/SrTiO_3(100)$, Pt(100)/MgO(100), Ir(100)/MgO(100), Ru(100)/MgO(100), and the like are nominated.

(Buffer Layer Material)

As material of the buffer layer, material with the lattice constant of which matches the lattice constant of the substrate within a range of difference of not more than 8% is preferable. In addition, as the buffer layer, oxide that can form film with a sputtering method, a MO-CVD method, and laser abrasion method is preferable and has a cubic crystal system or a pseudo cubic crystal system in crystal structure with a lattice constant of 3.6 Å to 6.0 Å is preferable.

As a particular configuration, those selected from the group consisting of selected from the group consisting of 10% $Y_2O_3$—$ZrO_2(100)/Si(100)$, 10% $Y_2O_3$—$ZrO_2(111)/Si(111)$, $SrTiO_3(100)/MgO(100)$, $MgAl_2O_4(100)/MgO(100)$, $BaTiO_3(001)/MgO(100)$, and the like are nominated. Where, the lattice constant of 10% $Y_2O_3$—$ZrO_2$ is 5.16 Å, that of $SrTiO_3$ is 3.91 Å, that of MgO is 4.21 Å, that of $MgAl_2O_4$ is 4.04 Å, that of $BaTiO_3$ is 3.99 Å, and that of Si is 5.43 Å. Consistency of the lattice constants will be calculated as follows in case of taking 1 0% $Y_2O_3$—$ZrO_2(111)/Si(111)$ as an example. 10% $Y_2O_3$—$ZrO_2(111)$ derives 5.16×42=7.30 Å while Si(111) derives $5.43 \times \sqrt{2} = 7.68$ Å and difference in consistency will become 4.9% which is turned out to be good.

The present invention may adopt any of the above described configurations.

[Liquid Discharge Apparatus]

A liquid discharge apparatus in use of the liquid discharge head of the present invention will be described by exemplifying the ink jet recording apparatus having an ink jet head.

Figure 2:
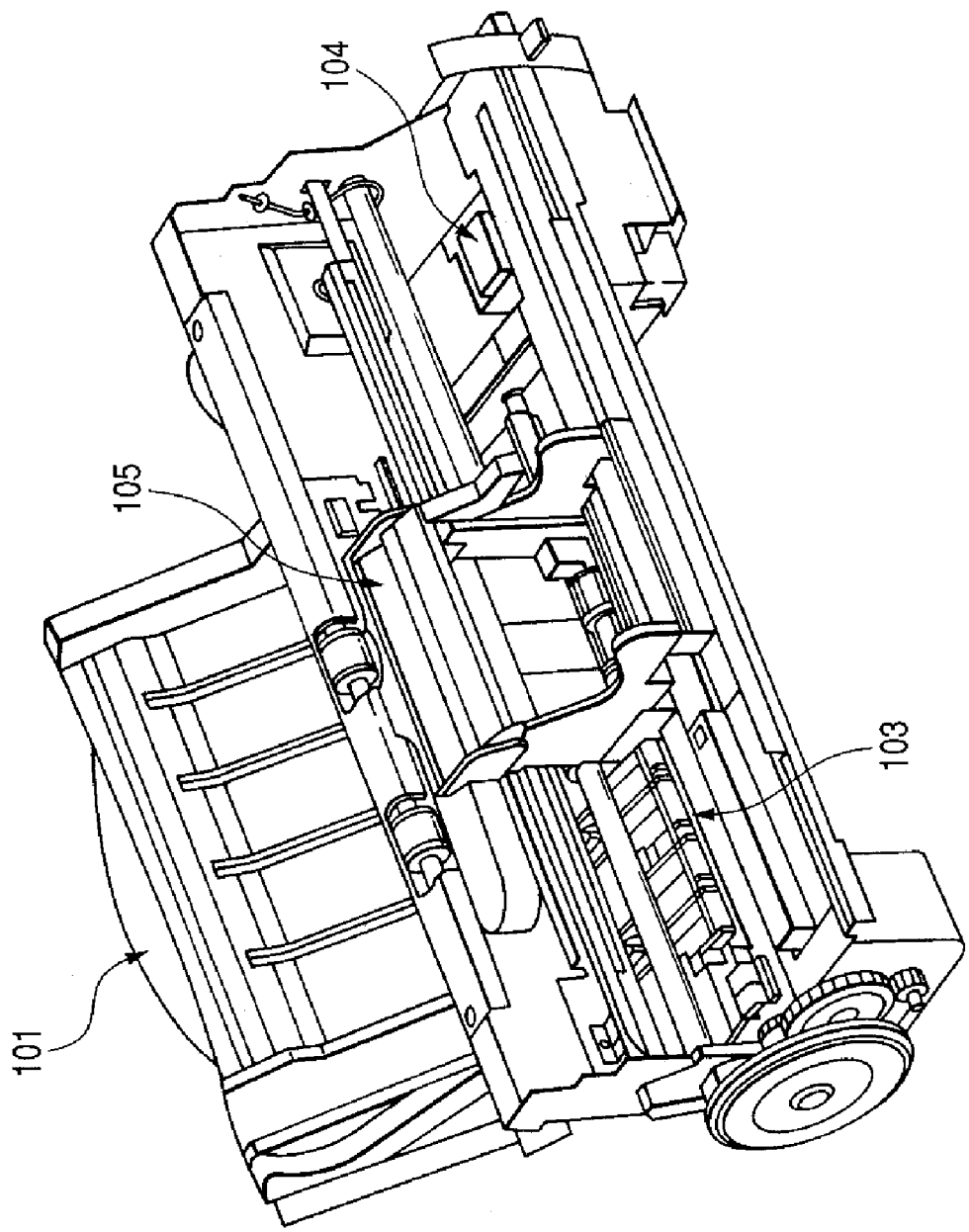
FIG. 2 is a schematic view of the operation mechanism portion in a state where the exterior portion of the ink jet recording apparatus in FIG. 1 has been displaced.

FIG. 1 shows a schematic view of the ink jet recording apparatus in use of an ink jet head to which a piezoelectric member element of the present invention can be applied preferably. In addition, FIG. 2 shows a schematic view of an operation mechanism portion in a state where exterior portion of the ink jet recording apparatus in FIG. 1 has been displaced.

There present are an automatic sheet feeding portion 101 for feeding recording sheet as recording media to inside the apparatus body automatically and a conveying portion 103 for guiding recording sheet delivered from the automatic sheet feeding portion 101 to a predetermined recording position and for guiding the recording sheet from the recording position to the discharge port 102. Moreover, the configuration consists of a recording portion for executing recording onto the recording sheet having been conveyed to the recording position and a recovering portion 104 for executing recovery processing to the recording portion. The ink jet head of the present invention is disposed to a carriage 105 and used.

In the present example, an example as a printer has been shown but the present invention may be used to a Fax or a complex machine, photocopier or industrial discharge apparatus.

In the following Examples, a composition will represent atomic number proportion.

EXAMPLE 1

Figure 6:
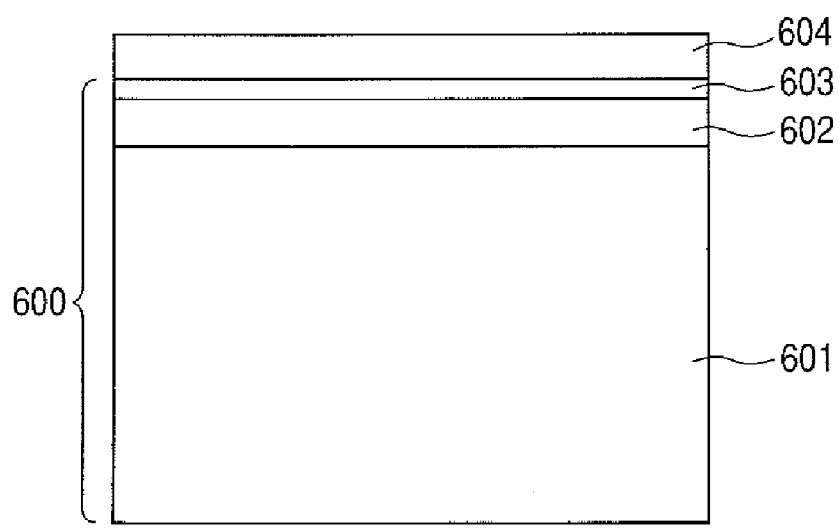
FIG. 6 is a sectional diagram of the configuration of a film piezoelectric member formed on a substrate.

FIG. 6 is a sectional diagram of configuration of a film piezoelectric member formed on a substrate.

Reference numeral 600 denotes a substrate for forming a film piezoelectric member. Reference numeral 601 denotes Si(100) substrate (t=200 μm, and stabilized zirconia (YSZ) is brought into reactive sputter film-forming at a substrate temperature of 800° C. in an Ar/$O_2$ atmosphere so as to form film of the vibration plate 602 of (100)YSZ epitaxial film of 3 μm. Next, as the lower electrode 603, strontium ruthenate (Sr-$RuO_3$(=SRO)) is brought into reactive sputter film-forming at a substrate temperature of 600° C. in an Ar/$O_2$ atmosphere so as to form film of the lower electrode 603 of (001)SRO epitaxial film of 300 nm. Thereby, the substrate 600 that can derive a film piezoelectric member with epitaxial growth is prepared.

Next, a method of forming a film piezoelectric member 604 will be described.

Figure 7:
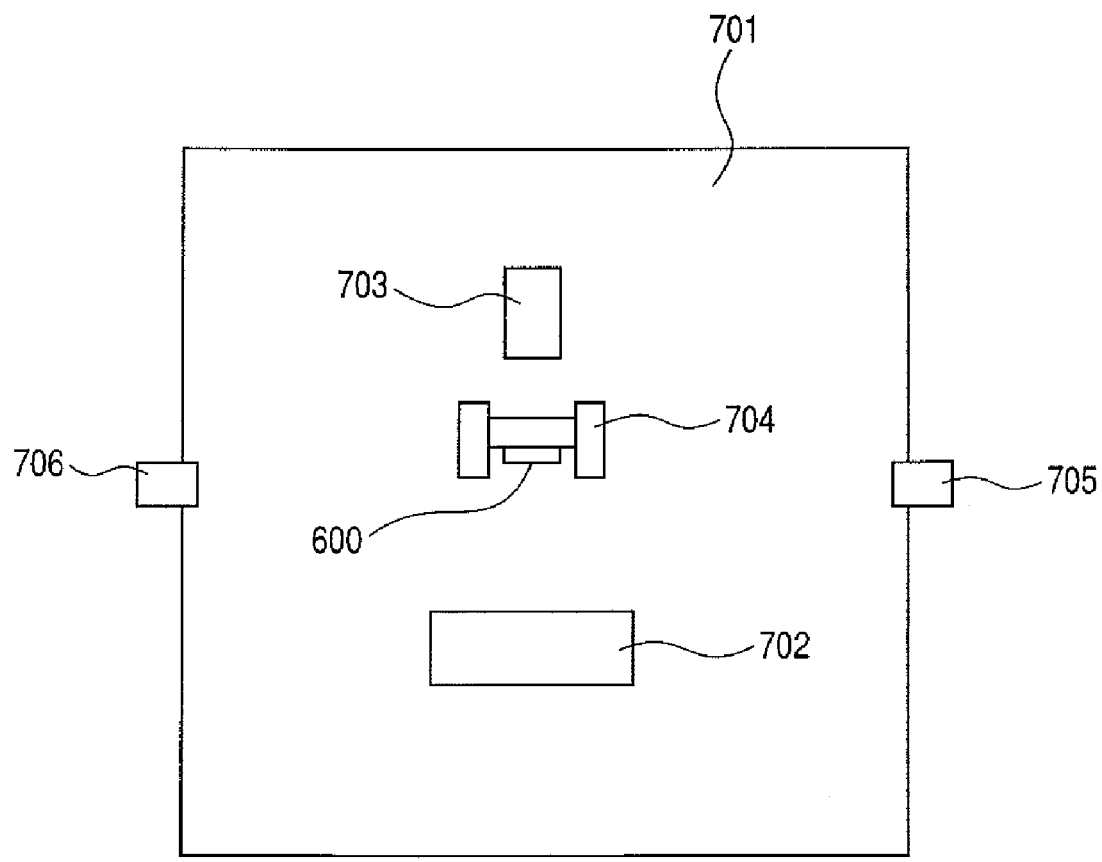
FIG. 7 is a schematic diagram of an RF magnetron sputter apparatus.

FIG. 7 is a schematic diagram of an RF magnetron sputter apparatus for forming the film piezoelectric member 604 onto the above described substrate. Reference numeral 701 denotes a film forming chamber, reference numeral 702 denotes a source material target, and reference numeral 703 denotes heating mechanism that is configured to be capable of heating the substrate 600 and maintaining the substrate temperature in a balanced state at the time of forming film.

In the present Example 1, a sintered member with composition proportion of Pb/Mg/Nb/Ti=120/23.3/46.7/30 was prepared as the source material target 702. For the source material target 702, to a desired composition of film, Mg, Nb, and Ti can be brought into film forming with approximately the same composition, but it is difficult for Pb to enter another metal element during film forming and therefore, the one with an excess amount for a desired film composition is used.

The substrate 600 where the vibration plate 602 and the lower electrode 603 have been formed is fixed to a substrate holder 704 so that sputtering film-forming is operated on the film piezoelectric member 604 to derive a film piezoelectric member of 2.5 μm.

The substrate temperature at the time of forming film is 600° C. and after film forming, $N_2$ is at first caused to flow in from a purge gas flow inlet 705 and at the same time the output of the heating mechanism 703 is caused to drop so as to make the substrate temperature reach 380° C. and a balanced state with 380° C. is retained for two minutes. At that time, time length required for the substrate temperature to reach 380° C. from 600° C. is around one minute.

As for determination of the substrate temperature at the time of forming film, the required lowest temperature can be determined based on judgment whether or not piezoelectric member film can be formed to derive epitaxial film or uniaxial orientation film. For a lot of cases, piezoelectric member film is formable, in general, at not less than 400° C. The reason is deemed that atoms disposed on the substrate can derive required heat energy so as to be rearranged at the nearby most stable locations from the point where they are attached.

In addition, as for the highest temperature, Pb with pressure of saturated vapor that is lower compared with the other configuring atoms might be evaporated again during film forming within a range significantly in excess of the required lowest temperature, which will decrease the Pb amount of film during film forming. Therefore, the highest temperature that enables film forming can be determined by confirming structure assessment of the formed film and Pb amount.

In addition, after film forming, the temperature for retaining the substrate temperature temporarily at the time of temperature drop is preferably around $Tc_{bulk}+100°$ C. As for around $Tc_{bulk}+100°$ C., a range of $Tc_{bulk}+(80°$ C. to 120° C.) will do. In that temperature region, rearrangement of the piezoelectric member film material atoms is feasible and that is a region enabling removal of composition distribution in the film thickness direction during film forming.

On the other hand, the highest value of temperature for retaining the substrate temperature temporarily at the time of temperature drop may go away from inside the film formed of Pb atoms inside piezoelectric member film material atoms of the present invention. In a state after film forming is over, source material Pb atoms will no longer be supplied on the substrate newly and therefore the highest temperature thereof will become lower than the highest temperature in the midst of film forming. Also as to the temperature for retaining this substrate temperature temporarily, the highest temperature can be determined by confirming the Pb amount that has formed film.

In addition, as for the time period for retaining the substrate temperature temporarily at the time of temperature drop, it is necessary to spend time that will enable diffusion phenomena required for the objective redisposition, but for that, the shortest time period can be determined among combinations with retaining temperature. In addition, in the temperature range where atoms such as Pb are not easily diffused after film forming, the temperature may be retained for a long time period. Determination may be made appropriately in consideration of throughput to completion of film forming.

Next, the output of the heating mechanism 703 is set to 0 so as to increase the flow of $N_2$ that is caused to flow in from the purge gas flow inlet 705 and to decrease the substrate temperature to reach not more than 50° C. In the present example, the temperature was cause to drop substantially to reach room temperature (27° C.). At that time, the time lapsed for the temperature drop was five minutes. Here, reference numeral 706 denotes the purge gas discharge port.

The time to cause a temperature drop from 600° C. to 380° C. corresponds to the time lapsed for Step 1 in the method of manufacturing film piezoelectric member of the present invention. Two-minute balancing time at 380° C. corresponds to the time that lapsed for Step 2. The time period to cause the temperature drop from 380° C. to the room temperature 27°

C. corresponds to the time that lapsed for Step 3. At that time, the temperature drop rate of Step 3 is 70.6° C./min.

As to the temperature drop rate of Step 3, the rate is preferably made as large as possible in order to control the binding state of the substrate positively. This operation of rapid cooling can control dielectric characteristics of a film-formed piezoelectric member, which is deemed to be a large factor.

X-ray structure analysis has been executed on the film piezoelectric member 604 that was formed as described above to confirm the film piezoelectric member 604 to be film having undergone epitaxial growth and be single crystal.

In addition, composition analysis has been operated with ICP optical emission spectrometry to note the composition of the film piezoelectric member 604 being Pb/Mg/Nb/Ti=110/23.3/46.7/30.

Next, with the substrate 600 where the film piezoelectric member 604 has been formed, the process of producing an ink jet head will be described with reference to FIGS. 8A, 8B, 8C, and 8D.

Figure 8A:
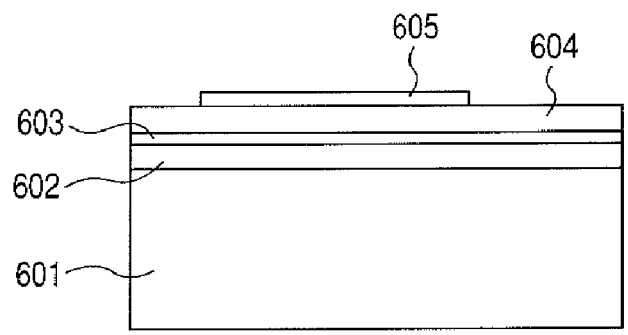
FIGS. 8A, 8B, 8C, and 8D are drawings for explaining a process of producing an ink jet head

Au was brought into film forming with a DC sputtering method to derive thickness of 200 nm on the film piezoelectric member 604 formed on the substrate 600 as an upper electrode 605 subject to patterning over 0.15 mm×5 mm corresponding with respective individual liquid chambers of the ink jet head (FIG. 8A).

Figure 8B:
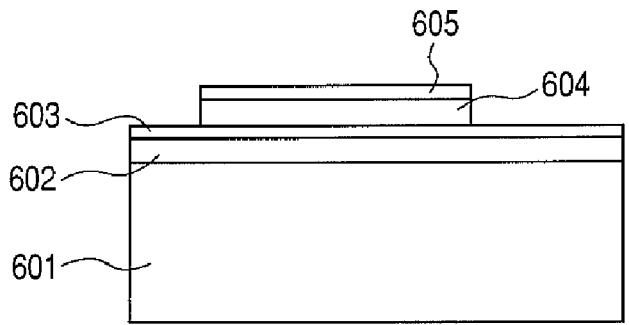

Next, the upper electrode 605 subject to patterning was masked so that the film piezoelectric member 604 was removed through a dry etching process (FIG. 8B).

Figure 8C:
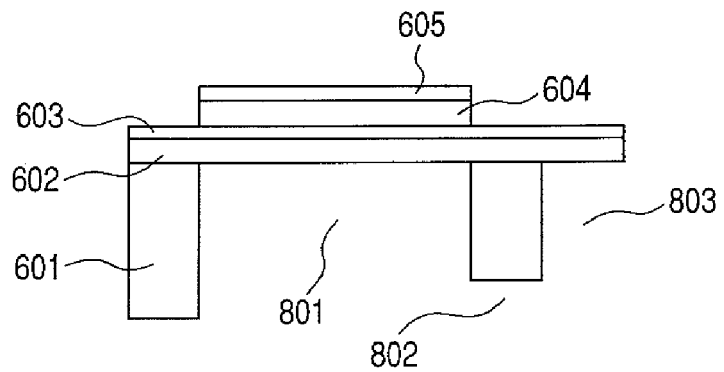

Next, the Si substrate 601 undertook two-step etching through a dry etching process so as to cast an individual liquid chamber 801, a choking portion 802, and a common liquid chamber 803 (FIG. 8C).

Figure 8D:
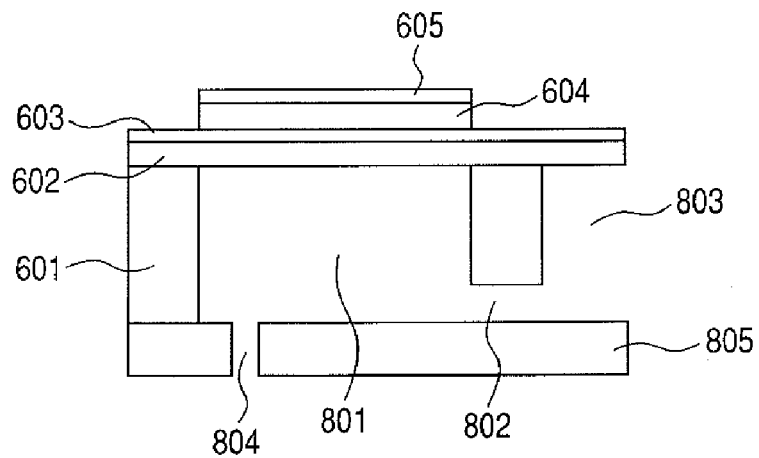

Next, a nozzle plate 805 having a discharge port 804 of 30 μmφ is bonded together with the Si substrate 601 with organic adhesive to produce the ink jet head (FIG. 8D).

Property assessment on the film piezoelectric member 604 and a method of performance assessment on an ink jet head in use thereof will be described.

The above described film piezoelectric member 604 formed on the substrate 600 was prepared so as to form 200 nm of 0.5 mmφ Au electrode with DC sputtering to prepare as a piezoelectric member element for measuring relative dielectric constants. The relative dielectric constant of the film piezoelectric member 604 was measured between the portion made to expose the SRO lower electrode 603 onto the surface and the 0.5 mmφ Au electrode at every 10° C. while raising temperature from the room temperature 25° C. to 605° C. with the heating prober to derive Tc from those changes.

As for measurement of the relative dielectric constants, an impedance analyzer was used to execute impedance measurement to adopt values calculated from capacitance derived as a parallel equivalent circuit of capacitor resistance.

As for performance assessment on the ink jet head, the use environment temperature was set to 25° C. and 40° C. and, under that environment, the discharge ink liquid amount at the time of 10 kHz driving was measured to assess the amount of change due to that use environment temperature.

Table 1 shows assessment results described so far.

In the table, those with difference in discharge amount at 25° C. and at 40° C. of less than 3% were set to carry A and those of less than 5% were set to carry B.

EXAMPLE 2

Except that a temperature drop was carried out continuously from 600° C. for ten minutes to reach 25° C. after forming a film piezoelectric member 604, a piezoelectric member element for measuring relative dielectric constants and an ink jet head were produced, likewise as Example 1, to assess their performance. Table 1 shows results thereof.

Here, it was confirmed with X-ray structure analysis that the formed film piezoelectric member 604 was single crystal and an outcome of composition analysis by ICP optical emission spectrometry turned out to be Pb/Mg/Nb/Ti=110/43.3/26.7/30.

EXAMPLE 3

A sintered member with composition proportion of Pb/Zn/Nb/Ti=120/30.3/60.7/9 was prepared as the source material target 702 and the temperature to be retained in a balanced state on the temperature at the time of a temperature drop after forming the film piezoelectric member 604 was set to 400° C. (Step 2). Otherwise, likewise as Example 1, the film piezoelectric member 604 was derived.

As described above, X-ray structure analysis was carried out to confirm that the film piezoelectric member 604 was film having undergone epitaxial growth and was single crystal.

In addition, composition analysis by ICP optical emission spectrometry was carried out to note that a composition of the film piezoelectric member 604 was Pb/Zn/Nb/Ti=108/30.3/60.7/9.

Moreover, an ink jet head was produced, likewise as Example 1, to assess its performance. Table 1 shows results thereof.

EXAMPLE 4

A sintered member with composition proportion of Pb/Ni/Nb/Ti=120/20/40/40 was prepared as the source material target 702 and the temperature to be retained in a balanced state on the temperature at the time of a temperature drop after forming the film piezoelectric member 604 was set to 300° C. (Step 2). Otherwise, likewise as Example 1, the film piezoelectric member 604 was derived.

As described above, X-ray structure analysis was carried out to confirm that the film piezoelectric member 604 was film having undergone epitaxial growth and was single crystal.

In addition, composition analysis by ICP optical emission spectrometry was carried out to note that a composition of the film piezoelectric member 604 was Pb/Ni/Nb/Ti=110/20/40/40.

Moreover, an ink jet head was produced, likewise as Example 1, to assess its performance. Table 1 shows results thereof.

EXAMPLE 5

A sintered member with composition proportion of Pb/Sc/Nb/Ti=120/27.5/27.5/45 was prepared as the source material target 702 and the temperature to be retained in a balanced state on the temperature at the time of a temperature drop after forming the film piezoelectric member 604 was set to 350° C. (Step 2). Otherwise, likewise as Example 1, the film piezoelectric member 604 was derived.

As described above, X-ray structure analysis was carried out to confirm that the film piezoelectric member 604 was film having undergone epitaxial growth and was single crystal.

In addition, composition analysis by ICP optical emission spectrometry was carried out to note that a composition of the film piezoelectric member 604 was Pb/Sc/Nb/Ti=115/27.5/27.5/45.

Moreover, an ink jet head was produced, likewise as Example 1, to assess its performance. Table 1 shows results thereof.

EXAMPLE 6

A sintered member with composition proportion of Pb/Sc/Ta/Ti=120/27.5/27.5/45 was prepared as the source material target 702 and the temperature to be retained in a balanced state on the temperature at the time of a temperature drop after forming the film piezoelectric member 604 was set to 350° C. (Step 2). Otherwise, likewise as Example 1, the film piezoelectric member 604 was derived.

As described above, X-ray structure analysis was carried out to confirm that the film piezoelectric member 604 was film having undergone epitaxial growth and was single crystal.

In addition, composition analysis by ICP optical emission spectrometry was carried out to note that a composition of the film piezoelectric member 604 was Pb/Sc/Ta/Ti=115/27.5/27.5/45.

Moreover, an ink jet head was produced, likewise as Example 1, to assess its performance. Table 1 shows results thereof.

EXAMPLE 7

A sintered member with composition proportion of Pb/Yb/Nb/Ti=120/25/25/50 was prepared as the source material target 702 and the temperature to be retained in a balanced state on the temperature at the time of a temperature drop after forming the film piezoelectric member 604 was set to 450° C. (Step 2). Otherwise, likewise as Example 1, the film piezoelectric member 604 was derived.

As described above, X-ray structure analysis was carried out to confirm that the film piezoelectric member 604 was film having undergone epitaxial growth and was single crystal.

In addition, composition analysis by ICP optical emission spectrometry was carried out to note that composition of the film piezoelectric member 604 was Pb/Yb/Nb/Ti=110/25/25/50.

Moreover, an ink jet head was produced, likewise as Example 1, to assess its performance. Table 1 shows results thereof.

EXAMPLE 8

A sintered member with composition proportion of Pb/In/Nb/Ti=120/33/33/34 was prepared as the source material target 702 and the temperature to be retained in a balanced state on the temperature at the time of a temperature drop after forming the film piezoelectric member 604 was set to 350° C. (Step 2). Otherwise, likewise as Example 1, the film piezoelectric member 604 was derived.

As described above, X-ray structure analysis was carried out to confirm that the film piezoelectric member 604 was film having undergone epitaxial growth and was single crystal.

In addition, composition analysis by ICP optical emission spectrometry was carried out to note that a composition of the film piezoelectric member 604 was Pb/In/Nb/Ti=105/33/33/34.

Moreover, an ink jet head was produced, likewise as Example 1, to assess its performance. Table 1 shows results thereof.

EXAMPLE 9

An Si(100) substrate in which an $SiO_2$ layer of thermally-oxidized film is formed in thickness of 100 nm is prepared as the substrate for forming a piezoelectric member. After Ti in thickness of 4 nm was formed thereon with a sputtering method, Pt in thickness of 200 m was formed as a lower electrode layer with a sputtering method while setting the substrate temperature to 300° C. At that time, Pt was (100) uniaxial orientation film. Thereby, a substrate 600 from which a film piezoelectric member or uniaxial crystal film can be made was prepared.

Otherwise, likewise as Example 1, the film piezoelectric member 604 was derived.

As described above, X-ray structure analysis was carried out to confirm that the film piezoelectric member 604 was uniaxial crystal.

In addition, composition analysis by ICP optical emission spectrometry was carried out to note that a composition of the film piezoelectric member 604 was Pb/Mg/Nb/Ti=110/23.3/46.7/30.

Moreover, an ink jet head was produced, likewise as Example 1, to assess its performance. Table 1 shows result thereof.

COMPARATIVE EXAMPLE 1

A PMN-PT in a bulk state (10 mm×10 mm×0.5 mm) was prepared and temperature changes in relative dielectric constant were measured likewise Example 1 to derive Tc. Table 1 shows results thereof. Here, since it was difficult to make an ink jet head with PMN-PT in a bulk state, assessment on the ink jet head was not feasible.

COMPARATIVE EXAMPLE 2

A sintered member with composition proportion of Pb/Ni/Nb/Ti=120/20/40/40 was prepared as the source material target 702. After forming the film piezoelectric member 604, gas supply for sputter film forming was stopped, the substrate heating was stopped while a vacuum state was retained so as to carry out natural cooling on the substrate in which the film piezoelectric member was formed.

Otherwise, likewise as Example 1, the film piezoelectric member 604 was derived.

As described above, X-ray structure analysis was carried out to confirm that the film piezoelectric member 604 was film having undergone epitaxial growth and was single crystal.

In addition, composition analysis by ICP optical emission spectrometry was carried out to note that composition of the film piezoelectric member 604 was Pb/Ni/Nb/Ti=110/20/40/40.

Moreover, an ink jet head was produced, likewise as Example 1, to assess its performance. Table 1 shows results thereof. Head characteristics assessment for Comparative Example 2 is C (not good).

[Property Values and Assessment Between the Present Examples and Comparative Examples]

The Table 1 described below shows property values on piezoelectric members of the above described respective examples and comparative examples and assessment on a head in use of the piezoelectric member.

TABLE 1

| | B composition | Tc (° C.) | Tc$_{bulk}$ (° C.) | $\epsilon_{RT}$ | $\epsilon_{MAX}$ | $(\epsilon_{MAX}-\epsilon_{RT})/(t_{MAX}-25)$ | $t_{MAX}$(° C.) | Ink discharge amount change (%) | Head characteristics assessment |
|---|---|---|---|---|---|---|---|---|---|
| Example 1 | Mg/Nb/Ti 23.3/46.7/30 | 410 | 140 | 750 | 1010 | 1.49 | 200 | 0.50 | A |
| Example 2 | Mg/Nb/Ti 23.3/46.7/30 | 350 | 140 | 800 | 1300 | 2.86 | 200 | 0.75 | B |
| Example 3 | Zn/Nb/Ti 30.3/60.7/9 | 380 | 180 | 700 | 1250 | 3.14 | 200 | 0.80 | B |
| Example 4 | Ni/Nb/Ti 20/40/40 | 190 | 130 | 580 | 1230 | 3.94 | 190 | 0.95 | B |
| Example 5 | Sc/Nb/Ti 27.5/27.5/45 | 330 | 210 | 480 | 790 | 1.77 | 200 | 0.60 | A |
| Example 6 | Sc/Ta/Ti 27.5/27.5/45 | 310 | 205 | 350 | 750 | 2.29 | 200 | 0.70 | A |
| Example 7 | Yb/Nb/Ti 25/25/50 | 490 | 325 | 550 | 680 | 0.74 | 200 | 0.40 | A |
| Example 8 | In/Nb/Ti 33/33/34 | 470 | 320 | 520 | 670 | 0.86 | 200 | 0.45 | A |
| Example 9 | Mg/Nb/Ti 23.3/46.7/30 | 330 | 140 | 820 | 2530 | 9.77 | 200 | 1.20 | B |
| Comparative example 1 | Mg/Nb/Ti 23.3/46.7/30 | 140 | ← | 3500 | 38000 | 300 | 140 | — | — |
| Comparative example 2 | Ni/Nb/Ti 20/40/40 | 160 | 130 | 630 | 2100 | 10.89 | 160 | 2.50 | C |

FIG. 10 shows temperature dependency of relative dielectric constants of piezoelectric members of the present examples and a prior art bulk state piezoelectric member. The horizontal axis of the graph scales temperature and the vertical axis scales relative dielectric constants in logarithm. Reference character A represents measured values of the film piezoelectric member PMNT of Example 1, reference character B represents measured values of the film piezoelectric member PZNT of Example 3 and reference character C represents measured values of the bulk state piezoelectric member PMNT of Comparative Example 1.

As shown in FIG. 10, temperature dependency of relative dielectric constants in film piezoelectric member of the present examples is apparently suppressed compared with known bulk state piezoelectric members. Consequently, a highly reliable piezoelectric element carrying out stable performance against temperature changes and also in case of use under various environments can be derived.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application No. 2005-241379 filed Aug. 23, 2005, which is hereby incorporated by reference herein.

What is claimed is:

1. A piezoelectric member of single crystal or uniaxial crystal, wherein
   said piezoelectric member has a perovskite type oxide of a general formula $ABO_3$ with a main component of the A site being Pb and a main component of the B site containing at least three kinds of elements selected from the group consisting of Mg, Zn, Sc, In, Yb, Ni, Nb, Ti, and Ta, and $10 > (\epsilon_{MAX}-\epsilon_{RT})/(t_{MAX}-25) > 0.1$, where $\epsilon_{RT}$ is a relative dielectric constant of said piezoelectric member at 25° C. and 1 kHz, $\epsilon_{MAX}$ is the maximum value of the relative dielectric constant at not more than 200° C. and 1 kHz, and $t_{MAX}$ is a temperature indicative of the maximum value of the relative dielectric constant.

2. The piezoelectric member according to claim 1, wherein a film thickness of said piezoelectric member is not less than 1 μm and not more than 10 μm.

3. The piezoelectric member according to claim 2, wherein $Tc_{thin} > Tc_{bulk}+50$, where $Tc_{thin}$ is a Curie temperature of said piezoelectric member and $Tc_{bulk}$ is a Curie temperature of a bulk state piezoelectric member with the same metal atomic number proportion as that of said piezoelectric member excluding Pb.

4. The piezoelectric member according to claim 1, wherein $\epsilon_{Rt} < 1200$, where $\epsilon_{Rt}$ is the relative dielectric constant of said piezoelectric member at 25° C. and 1 kHz.

5. The piezoelectric member according to claim 1, wherein said perovskite type oxide $ABO_3$ can be expressed by $(Pb_k, \alpha_1)_x(Mg_m, Nb_n, Ti_o, \beta_p)_y O_3$, wherein $1 \leq x/y < 1.5$, $k+1=1$, $0.7 \leq k \leq 1$, $0 < 1 < 0.3$, $m+n+o+p=1$, $0.1 \leq m \leq 0.3$, $0.3 \leq n \leq 0.5$, $0.2 \leq o \leq 0.4$, and $0 \leq p < 0.3$ and α includes any element selected from the group consisting of La, Ca, Ba, Sr, Bi, and Sb while β includes any element selected from the group consisting of Pb, Sc, In, Yb, Ni, Ta, Co, W, Fe, and Sn.

6. The piezoelectric member according to claim 1, wherein said perovskite type oxide $ABO_3$ can be expressed by $(Pb_k, \alpha_1)_x(Zn_m, Nb_n, Ti_o, \beta_p)_y O_3$, wherein $1 \leq x/y < 1.5$, $k+1=1$, $0.7 \leq k \leq 1$, $0 < 1 < 0.3$, $m+n+o+p=1$, $0.2 \leq m \leq 0.4$, $0.5 \leq n \leq 0.7$, $0.05 \leq o \leq 0.2$, and $0 \leq p < 0.3$ and α includes any element selected from the group consisting of La, Ca, Ba, Sr, Bi, and Sb while β includes any element selected from the group consisting of Pb, Sc, Yb, Ta, Mg, Ni, Co, W, Fe, Sn, and In.

7. The piezoelectric member according to claim 1, wherein said perovskite type oxide $ABO_3$ can be expressed by $(Pb_k, \alpha_1)_x(Ni_m, Nb_n, Ti_o, \beta_p)_y O_3$, wherein $1 \leq x/y < 1.5$, $k+1=1$, $0.7 \leq k \leq 1$, $0 < 1 < 0.3$, $m+n+o+p=1$, $0.1 \leq m \leq 0.3$, $0.3 \leq n \leq 0.5$, $0.3 \leq o \leq 0.5$, and $0 \leq p < 0.3$ and α includes any element selected from the group consisting of La, Ca, Ba, Sr, Bi, and Sb while β includes any element selected from the group consisting of Pb, Sc, In, Yb, Mg, Ta, Co, W, Fe, and Sn.

8. The piezoelectric member according to claim 1, wherein said perovskite type oxide $ABO_3$ can be expressed by $(Pb_k, \alpha_1)_x(Sc_m, Nb_n, Ti_o, \beta_p)_y O_3$, wherein $1 \leq x/y < 1.5$, $k+1=1$, $0.7 \leq k \leq 1$, $0 < 1 < 0.3$, $m+n+o+p=1$, $0.1 \leq m \leq 0.4$, $0.1 \leq n \leq 0.4$, $0.3 \leq o \leq 0.5$, and $0 \leq p < 0.3$ and α includes any element selected from the group consisting of La, Ca, Ba, Sr, Bi, and Sb while β includes any element selected from the group consisting of Pb, Ta, In, Yb, Mg, Ni, Co, W, Fe, and Sn.

9. The piezoelectric member according to claim 1, wherein said perovskite type oxide $ABO_3$ can be expressed by $(Pb_k, \alpha_1)_x(Sc_m, Ta_n, Ti_o, \beta_p)_y O_3$, wherein $1 \leq x/y < 1.5$, $k+1=1$, $0.7 \leq k \leq 1$, $0 < 1 < 0.3$, $m+n+o+p=1$, $0.1 \leq m \leq 0.4$, $0.1 \leq n \leq 0.4$, $0.3 \leq o \leq 0.5$, and $0 \leq p < 0.3$ and α includes any element selected from the group consisting of La, Ca, Ba, Sr, Bi, and Sb while β includes any element selected from the group consisting of Pb, Nb, In, Yb, Mg, Ni, Co, W, Fe, and Sn.

10. The piezoelectric member according to claim 1, wherein said perovskite type oxide $ABO_3$ can be expressed by $(Pb_k, \alpha_1)_x(Yb_m, Nb_n, Ti_o, \beta_p)_y O_3$, wherein $1 \leq x/y < 1.5$, $k+1=1$, $0.7 \leq k \leq 1$, $0 < 1 < 0.3$, $m+n+o+p=1$, $0.1 \leq m \leq 0.4$, $0.1 \leq n \leq 0.4$, $0.4 \leq o \leq 0.6$, and $0 \leq p < 0.3$ and α includes any element selected from the group consisting of La, Ca, Ba, Sr, Bi, and Sb while β includes any element selected from the group consisting of Pb, Sc, In, Ta, Mg, Ni, Co, W, Fe, and Sn.

11. The piezoelectric member according to claim 1, wherein said perovskite type oxide $ABO_3$ can be expressed by $(Pb_k, \alpha_1)_x(In_m, Nb_n, Ti_o, \beta_p)_y O_3$, wherein $1 \leq x/y < 1.5$, $k+1=1$, $0.7 \leq k \leq 1$, $0 < 1 < 0.3$, $m+n+o+p=1$, $0.2 \leq m \leq 0.4$, $0.2 \leq n \leq 0.4$, $0.2 \leq o \leq 0.5$, and $0 \leq p < 0.3$ and α includes any element selected from the group consisting of La, Ca, Ba, Sr, Bi, and Sb while β includes any element selected from the group consisting of Pb, Sc, Yb, Ta, Mg, Ni, Co, W, Fe, and Sn.

12. A piezoelectric member of single crystal or uniaxial crystal, wherein
said piezoelectric member has a perovskite type oxide of a general formula $ABO_3$ with a main component of the A site being Pb and a main component of the B site containing at least three kinds of elements selected from the group consisting of Mg, Zn, Sc, In, Yb, Ni, Nb, Ti, and Ta,
a film thickness of said piezoelectric member is not less than 1 μm and not more than 10 μm, and $$Tc_{thin} > Tc_{bulk} + 50,$$

where $Tc_{thin}$ is a Curie temperature of said piezoelectric member and $Tc_{bulk}$ is a Curie temperature of a bulk state piezoelectric member with the same metal atomic number proportion as that of said piezoelectric member excluding Pb.

13. A piezoelectric member element comprising a piezoelectric member and a pair of electrodes in contact with said piezoelectric member,
wherein said piezoelectric member is of single crystal or uniaxial crystal,
said piezoelectric member has a perovskite type oxide of a general formula $ABO_3$ with a main component of the A site being Pb and a main component of the B site containing at least three kinds of elements selected from the group consisting of Mg, Zn, Sc, In, Yb, Ni, Nb, Ti, and Ta, $$10 > (\epsilon_{MAX} - \epsilon_{RT})/(t_{MAX} - 25) > 0.1,$$

where $\epsilon_{RT}$ is a relative dielectric constant at 25° C. and 1 kHz, $\epsilon_{MAX}$ is the maximum value of the relative dielectric constant at not more than 200° C. and 1 kHz, and $t_{MAX}$ is a temperature indicative of the maximum value of the relative dielectric constant, and
said piezoelectric member has film thickness of not less than 1 μm and not more than 10 μm.

14. A liquid discharge head having an individual liquid chamber in communication with a discharge port and a piezoelectric member element provided in correspondence with the individual liquid chamber and discharging liquid from said individual liquid chamber through said discharge port, wherein
said piezoelectric member element comprises a piezoelectric member and a pair of electrodes in contact with said piezoelectric member,
said piezoelectric member is of single crystal or uniaxial crystal,
said piezoelectric member has a perovskite type oxide of a general formula $ABO_3$ with a main component of the A site being Pb and a main component of the B site containing at least three kinds of elements selected from the group consisting of Mg, Zn, Sc, In, Yb, Ni, Nb, Ti, and Ta, $$10 > (\epsilon_{MAX} - \epsilon_{RT})/(t_{MAX} - 25) > 0.1,$$

where $\epsilon_{RT}$ is a relative dielectric constant of said piezoelectric member at 25° C. and 1 kHz, $\epsilon_{MAX}$ is the maximum value of the relative dielectric constant at not more than 200° C. and 1 kHz, and $t_{MAX}$ is a temperature indicative of the maximum value of the relative dielectric constant, and
said piezoelectric member has film thickness of not less than 1 μm and not more than 10 μm.

15. A liquid discharge apparatus having a liquid discharge head having an individual liquid chamber in communication with a discharge port and a piezoelectric member element provided in correspondence with the individual liquid chamber and discharging liquid from said individual liquid chamber through said discharge port, wherein
said piezoelectric member element comprises a piezoelectric member and a pair of electrodes in contact with said piezoelectric member,
said piezoelectric member is of single crystal or uniaxial crystal,
said piezoelectric member has a perovskite type oxide of a general formula $ABO_3$ with a main component of the A site being Pb and a main component of the B site containing at least three kinds of elements selected from the group consisting of Mg, Zn, Sc, In, Yb, Ni, Nb, Ti, and Ta, $$10 > (\epsilon_{MAX} - \epsilon_{RT})/(t_{MAX} - 25) > 0.1,$$

where $\epsilon_{RT}$ is a relative dielectric constant of said piezoelectric member at 25° C. and 1 kHz, $\epsilon_{MAX}$ is the maximum value of the relative dielectric constant at not more than 200° C. and 1 kHz, and $t_{MAX}$ is a temperature indicative of the maximum value of the relative dielectric constant, and
said piezoelectric member has film thickness of not less than 1 μm and not more than 10 μm.

* * * * *